US008765903B2

(12) United States Patent
Sasaki et al.

(10) Patent No.: US 8,765,903 B2
(45) Date of Patent: Jul. 1, 2014

(54) CARBAZOLE POLYMER AND METHOD OF MANUFACTURING SAME

(75) Inventors: Masaomi Sasaki, Shizuoka (JP);
Shigeyuki Harada, Shizuoka (JP);
Takashi Okada, Kanagawa (JP);
Toshiya Sagisaka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 190 days.

(21) Appl. No.: 13/226,992

(22) Filed: Sep. 7, 2011

(65) Prior Publication Data

US 2012/0065353 A1    Mar. 15, 2012

(30) Foreign Application Priority Data

Sep. 9, 2010    (JP) .................. 2010-201624

(51) Int. Cl.
*C08G 79/08* (2006.01)
*C08G 79/00* (2006.01)

(52) U.S. Cl.
USPC ........... 528/394; 528/397; 528/423; 528/424; 528/4; 528/8

(58) Field of Classification Search
USPC .......................... 528/394, 397, 423, 424, 4, 8
See application file for complete search history.

(56) References Cited

U.S. PATENT DOCUMENTS

| 4,672,149 | A | 6/1987 | Yoshikawa et al. |
| 7,166,689 | B2 | 1/2007 | Sagisaka et al. |
| 7,550,554 | B2 | 6/2009 | Sagisaka et al. |
| 2010/0219405 | A1 | 9/2010 | Sagisaka et al. |

FOREIGN PATENT DOCUMENTS

| CN | 101063035 A | 10/2007 |
| JP | 2004-339432 | 12/2004 |
| JP | 2005-54165 | 3/2005 |
| JP | 2005-158691 | 6/2005 |
| JP | 2007-262219 | 10/2007 |
| JP | 2010-37509 | 2/2010 |
| JP | 4498773 | 4/2010 |
| WO | WO 01/72927 A1 | 10/2001 |

OTHER PUBLICATIONS

Chinese official action dated Sep. 25, 2012 in a corresponding Chinese patent application No. 201110272503.0.
Miyaura, Norio, et al. (1995), "Palladium-Catalyzed Cross-Coupling Reactions of Organoboron Compounds," Chemical Reviews, vol. 95, No. 7, pp. 2457-2483.

(Continued)

*Primary Examiner* — Duc Truong
(74) *Attorney, Agent, or Firm* — Cooper & Dunham LLP

(57) ABSTRACT

A carbazole polymer containing a repeating unit represented by a chemical structure 1:

Chemical Structure 1

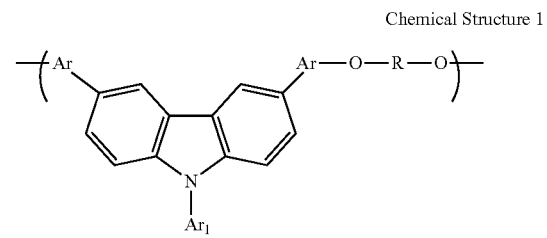

where R represents an aliphatic or alicyclic bifunctional group, Ar represents an aromatic hydrocarbon or heterocyclic ring bifunctional group, and $Ar_1$ represents an aromatic hydrocarbon or heterocyclic ring monofunctional group.

4 Claims, 2 Drawing Sheets

(56) References Cited

OTHER PUBLICATIONS

Tsutsui, Tetsuo, et al. (1999), "High Quantam Efficiency in Organic Light-Emitting Devices with Iridium-Complex as a Triplet Emissive Center," Japanese Journal of Applied Physics, vol. 38, pp. L 1502-L 1504.

Nov. 8, 2011 European search report in connection with counterpart European patent application No. 11 18 0636.

Vaitkeviciene, V., et al. (2006), "Hole-transporting [3/3']bicarbazolyl-based polymers and well-defined model compounds," European Polymer Journal, vol. 42, No. 10, pp. 2254-2260.

US 8,765,903 B2

CARBAZOLE POLYMER AND METHOD OF MANUFACTURING SAME

BACKGROUND OF THE INVENTION

1. Field of the Invention

The present invention relates to a carbazole polymer for an organic electroluminescent (EL) element and a method of manufacturing the carbazole polymer.

2. Description of the Background

Organic thin-layer electroluminescent (EL) components are attractive and research into their commercialization has continued because their self-luminescence provides advantages such as superior view angle dependency and visibility as well as space savings because the organic thin-layer EL components are a thin-layer type complete solid state component. At present, however, many areas requiring improvement remain, such as energy conversion efficiency, luminescent quantum efficiency, and stability (device durability).

Until now, organic thin-layer EL components using a low molecular weight compound or a polymer have been reported. With regard to the organic thin-layer EL components using a low molecular weight compound, it is reported that efficiency is improved by employing various laminate structures and durability is improved by suitably controlling the doping method.

However, in the case of low molecular aggregations, the layer state changes over a long time, which means that the organic thin-layer EL components using a low molecular weight compound has a fundamental problem with the stability of the layer.

With regard to the organic thin-layer EL components using polymer materials, poly-p-phenylenevinylene (PPV) series, poly-thiophenes, etc. have been studied extensively. However, these materials have difficulties about improving the purity and are fundamentally low in fluorescence quantum yield. Therefore, no EL component using these materials that demonstrates high performance has been obtained yet.

Considering that the polymer materials are essentially stable in a glass state, an excellent EL component can be structured if a high fluorescence quantum yield is imparted.

In addition, with regard to the layer forming method, while a vacuum deposition method is generally used for the low molecular weight compound case, a coating method is used for the polymer material, which is preferable in terms of cost. As described above, each has its own merits and demerits.

In addition, improvement of the efficiency using triplet exciton has been studied extensively (for example, refer to T. Tsutsui et. al. JPN. J. Appl. Phys. Vol. 38 L1502, published in 1999) and it is found that the luminance efficiency can be significantly improved. Accordingly, the number of reports on host materials for use in the luminous layer has been increasing. Among these, a representative example is 4,4'-bis (carbazolyl-9)biphenyl (CBP) represented by the following chemical structure.

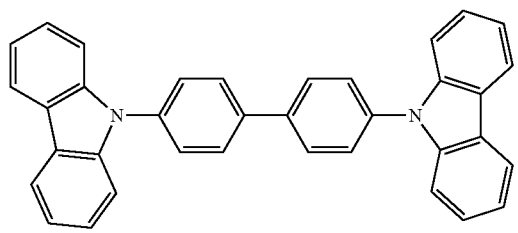 [SMILES: c1ccc2c(c1)c1ccccc1n2-c1ccc(-c2ccc(-n3c4ccccc4c4ccccc43)cc2)cc1]

Based on follow-up studies, however, it became clear that crystallization of CBP proceeds in the luminous layer, thereby shortening the life of the device (for example, refer to WO 01/72927-A1).

To avoid this problem, other carbazole compounds instead of CBP have been studied (for example, refer to Japanese patent application number 2005-158691 (JP-2005-158691-A).

In addition, polymer materials having a carbazole structure have been studied (for examples, refer to JP-2004-339432-A and JP-2007-262219-A). However, all of the compounds described therein have insufficient durability and luminance efficiency.

SUMMARY OF THE INVENTION

In view of the foregoing, the present invention provides a novel carbazole polymer that contains a repeating unit represented by a chemical structure 1:

Chemical Structure 1

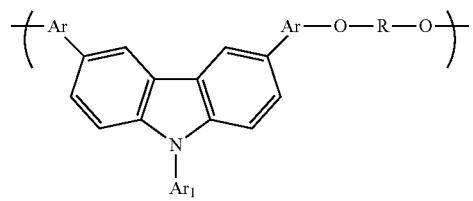

In the chemical structure 1, R represents an aliphatic or alicyclic bifunctional group, Ar represents an aromatic hydrocarbon or heterocyclic ring bifunctional group, and $Ar_1$ represents an aromatic hydrocarbon or heterocyclic ring monofunctional group.

It is preferred that the carbazole polymer mentioned above is manufactured by reaction between a dihalogen compound represented by the chemical structure 2 and a boronic acid derivative represented by the chemical structure 3:

Chemical Structure 2

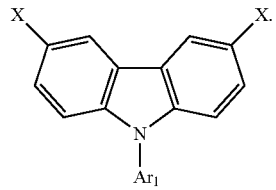

In the chemical structure 2, X represents a halogen atom.

Y—Ar—O—R—O—Ar—Y          Chemical Structure 3.

In the chemical structure 3, Y represents a boronic acid or an ester thereof.

It is still further preferred that the carbazole polymer mentioned above is represented by the chemical structure 4:

Chemical Structure 4

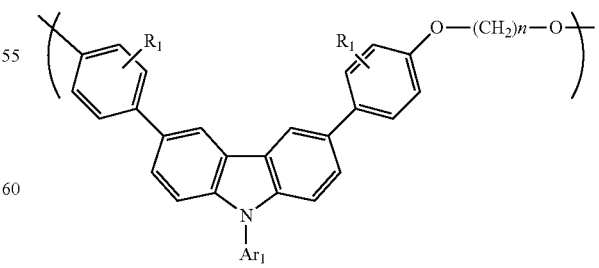

In the chemical structure 4, $R_1$ represents a hydrogen atom, a substituted or non-substituted alkyl group, a substituted or non-substituted alkoxy group, a halogen atom, a cyano group, a nitro group, or an aromatic hydrocarbon group and n represents an integer of 1 or higher.

As another aspect of the present invention, a method of manufacturing the carbazole mentioned above including reacting a dihalogen compound represented by a chemical structure 2 with a boronic acid derivative represented by a chemical structure 3:

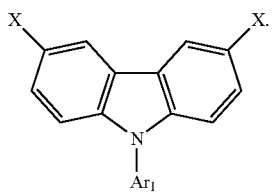

Chemical Structure 2

In the chemical structure 2, X represents a halogen atom; and

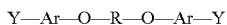

Chemical Structure 3

In the chemical structure 3, Y represents a boronic acid or an ester thereof.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION OF THE INVENTION

Figure 1:
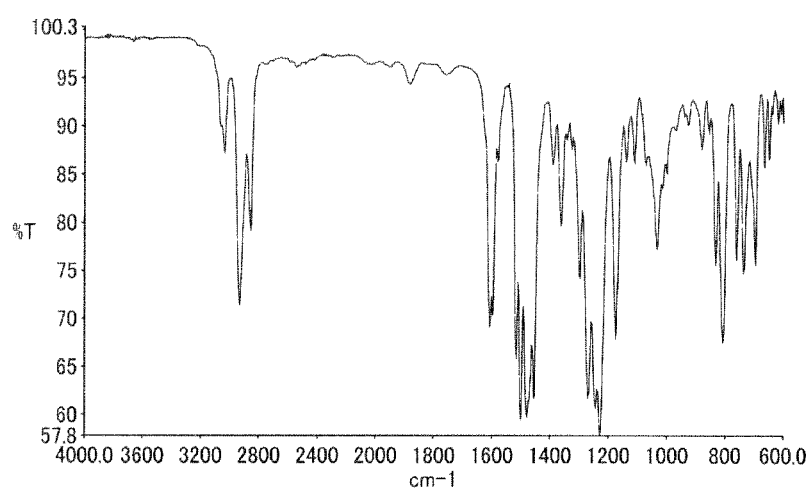
FIG. 1 is a diagram illustrating an infra-red spectrum (NaCl cast film) of a carbazole polymer obtained in Example 1 described later.

The present disclosure is described below in detail with reference to accompanying drawings.

The carbazole polymer of the present disclosure represented by the chemical structure 1 is manufactured by, for example, the following method.

That is, the carbazole polymer represented by the chemical structure 1 is manufactured by reacting a dihalogen compound represented by the chemical structure 2 with a boronic acid derivative represented by the chemical structure 3.

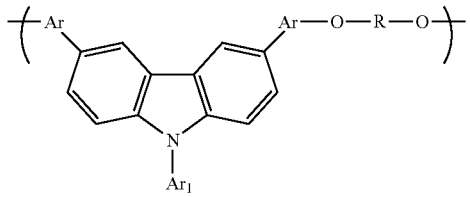

Chemical Structure 1

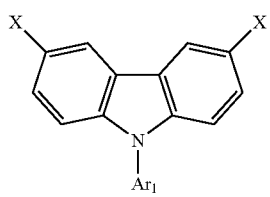

Chemical Structure 2

In the chemical structure 1, R represents an aliphatic or alicyclic bifunctional group, Ar represents an aromatic hydrocarbon or heterocyclic ring bifunctional group, and $Ar_1$ represents an aromatic hydrocarbon or heterocyclic ring monofunctional group.

In the chemical structure 2, X represents a halogen atom and $Ar_1$ represents an aromatic hydrocarbon or heterocyclic ring monofunctional group.

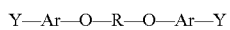

Chemical Structure 3

In the chemical structure 3, R represents an aliphatic bifunctional group and a cyclic aliphatic bifunctional group, Ar represents an aromatic hydrocarbon or heterocyclic ring bifunctional group, and Y represents a boronic acid or an ester thereof.

The dihalogen compound represented by the chemical structure 2 and the boronic acid derivative represented by the chemical structure 3 is based on Suzuki-Miyaura reaction (A. Chem. Rev. 95, 2457 published in 1995, authored by Miyaura N. and Suzuki A.), which is known as a cross-coupling reaction of an aryl boron compound and an organic halogen compound using a palladium catalyst.

A preferable halogen atom in the dihalogen compound represented by the chemical structure 2 is iodine or a bromine in terms of reactivity.

In addition, as the boronic acid derivative represented by the chemical structure 3, an aryl boronic acid ester synthesized from a halogenized aryl using a bis(pinacolato)diboron which is thermally stable and easily handled in the air can be also used in addition to an aryl boronic acid.

There is no specific limitation on the selection of the palladium catalyst. Specific examples thereof include, but are not limited to, $Pd(PPh_3)_4$, $PdCl_2(PPh_3)_2$, $Pd(OAc)_2$, and $PdCl_2$. Among them, $Pd(PPh_3)_4$ is most commonly used.

This reaction requires a base and preferably a relatively weak base such as $Na_2CO_3$ and $NaHCO_3$. In addition, considering the impact of steric barrier, a strong base such as $Ba(OH)_2$ and $K_3PO_4$ is preferable.

Specific examples of the other bases include, but are not limited to, sodium hydroxide, potassium hydroxide, and a metal alkoxide such as potassium t-butoxide, sodium t-butoxide, lithium t-butoxide, potassium 2-methyl-2-butoxide, sodium 2-methyl-2-butoxide, sodium methoxide, sodium ethoxide, potassium ethoxide, and potassium methoxide.

In addition, an organic base such as triethyl amine can be used as the base.

Specific examples of the reaction solvent include, but are not limited to, alcohol- or ether-based solvents such as methanol, ethanol, isopropanol, butanol, 2-methoxyethanol, 1,2-dimethoxyethane, bis(2-methoxyethyl)ether, cyclic ether solvents such as dioxane and tetrahydrofuran, benzene, toluene, xylene, dimethylsulfoxide, N,N-dimethylformamide, N-methylpyrrolidone, and 1,3-dimethyl-2-imidazolidinone.

With regard to the polymerization reaction, the reaction temperature, the reaction time, and the reaction concentration are set based on the reactivity and the solubility of the dihalogen compound represented by the chemical structure 2 or the boronic acid derivative represented by the chemical structure 2.

In addition, in the polymerization operation, a molecular weight control agent to control the molecular weight and a terminating agent to cap the end of the polymer as a terminal modifying group can be added before, during, or after the reaction. Therefore, the carbazole polymer of the present disclosure may have an end where a substitution group based on the terminating agent is connected.

The molecular weight of the polymer of the present disclosure is preferably from 1,000 to 1,000,000 and more preferably from 2,000 to 500,000 in polystyrene conversion number average molecular weight. When the molecular weight is too small, cracking tends to occur, there by degrading the filming property and practicality. When the molecular weight is too large, the solubility of such a polymer in a typical organic solvent tends to deteriorate, thereby increasing the viscosity of the solution, which also leads to a practicality problem.

In addition, the polymerization degree varies depending on the solubility of monomers for use in the reaction, that is, the dihalogen compound represented by the chemical structure 2 or the boronic acid derivative represented by the chemical structure 3. Therefore, the dihalogen compound represented by the chemical structure 2 or the boronic acid derivative represented by the chemical structure 3 should be selected considering the objective.

The thus-obtained carbazole polymer is used after removing impurities such as the catalyst used in polymerization, non-reacted remaining monomers, and a terminating agent. For these refinement operations, any of known methods can be used such as a re-precipitation method, a chromatography method, an adsorption method, an extraction method, a soxhlet extraction method, an ultra-filtration method, artificial dialysis, and a use of a scavenger to remove catalysts.

The polymer of the present disclosure manufactured by the manufacturing methods specified above can form a thin-layer having an excellent strength, toughness, and durability without cracking by a known film forming method such as a spin coating method, a cast method, a dip method, an inkjet method, a doctor blade method, and a screen printing and can be used as various kinds of functional element materials for a photoelectric conversion element, a thin-layer transistor element, a luminous element, etc.

Specific examples of the thus-obtained carbazole polymers represented by the chemical structure 1 include, but are not limited to, the following:

Among the polymers represented by the chemical structure 1, when Ar represents an aromatic hydrocarbon or heterocyclic ring bifunctional group, specific examples thereof include, but are not limited to, the following: bifunctional groups such as benzene, naphthalene, biphenyl, terphenyl, pyrene, fluorene, 9,9-dimethyl fluorene, azulene, anthracene, triphenylene, chrysene, 9-benzylidene fluorene, 5H-dibenzo[a,d]cycloheptene, [2,2]-paracyclophane, triphenyl amine, thiophene, benzothiophene, dithienyl benzene, furane, benzo furane, carbazole. These can have a substituted or non-substituted alkyl group, alkoxy group as substitution groups. Specific examples of the substituted or non-substituted alkyl groups include, but are not limited to, straight chain, branch chain, or cyclic alkyl groups having 1 to 25 carbon atoms and these alkyl groups may have a fluorine atom, a cyano group, or a phenyl group, and a phenyl group which is substituted by a halogen atom or a straight chain or branch chain alkyl group. Specific examples thereof include, but are not limited to, methyl group, ethyl group, n-propyl group, i-propyl group, t-butyl group, s-butyl group, n-butyl group, i-butyl group, pentyl group, hexyl group, heptyl group, octyl group, nonyl group, decyl group, 3,7-dimethyloctyl group, 2-ethylhexyl group, trifluoromethyl group, 2-cyanoethyl group, benzyl group, 4-chlorobenzyl group, 4-methylbenzyl group, cyclopentyl group, and cyclohexyl group.

In addition, in the case of a substituted or non-substituted alkoxy group, a specific example is an alkoxy group in which an oxygen atom is inserted at the bonding position of the alkyl group specified above.

In the chemical structure 1, in the case in which Ar1 is an aromatic hydrocarbon or a heterocyclic ring, it represents the aromatic hydrocarbon or heterocyclic ring monofunctional group specified for Ar.

In the chemical structure 1, in the case in which R is an aliphatic or alicyclic bifunctional group, it is identical to the substituted or non-substituted bifunctional alkyl group defined as the substitution group on the specified aromatic hydrocarbons or heterocyclic ring.

In addition, the polymer represented by chemical structure 1 is preferably a polymer represented by the following chemical structure 4.

Chemical Structure 4

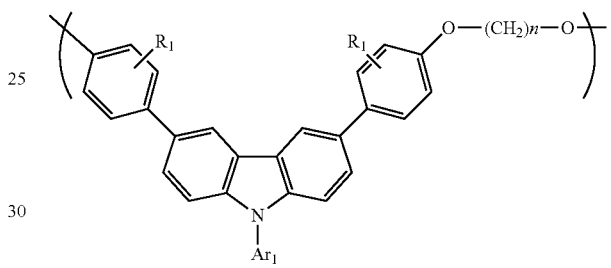

$R_1$ in the chemical structure 4 represents a substituted or non-substituted alkyl or alkoxy group, a halogen atom, a cyano group, a nitro group, or an aromatic hydrocarbon group. Specific examples of the substituted or non-substituted alkyl or alkoxy group are identical to the substitution groups defined as the substitution groups on the specified aromatic hydrocarbons or heterocyclic rings. In addition, the aromatic hydrocarbon group is identical to the aromatic hydrocarbon monofunctional group defined as specified above.

EXAMPLES

The boronic acid ester derivatives for use in Examples are described in JP-2010-37509.

Example 1

Mix 0.80 g of 3,6-dibromo-N-phenylcarbazole, 1.21 g of a boronic acid ester represented by the following chemical structure 5, 11.6 mg of tetrakis(triphenylphosphine)palladium, and 20 mg of tricapryl methyl ammonium chloride (Aliquat 336, manufactured by Sigma-Aldrich Co. LLC.). Subsequent to nitrogen substitution, add 12 ml of degassed toluene and 5.2 ml of 2M sodium carbonate to the mixture followed by reflux with heat for 13 hours;

Chemical Structure 5

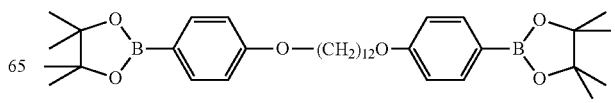

add 97 mg of phenyl boronic acid to the resultant followed by reflux with heat for five hours and add 0.10 ml of bromobenzene followed by reflux with heat for three hours to conduct terminal reaction; cool down the resultant to room temperature; drop the organic layer to methanol and water to obtain a coarse polymer; dissolve the coarse polymer in methylene chloride; add 1 g of palladium scavenger (silica gel modified by 3-mercapto propyl group) followed by one hour stirring and filtration; repeat washing the methylene chloride solution with deionized water until the conductivity of the washed water is equal to that of the deionized water; drop the resultant to methanol; filter the precipitate; dry the filtrate with heat to obtain 1.02 g of a white polymer represented by the following chemical structure 6 of the present disclosure.

Chemical Structure 6

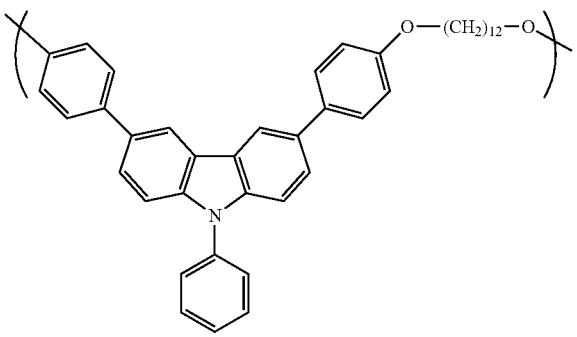

Element Analysis (Calculated Value)

C, 84.60% (84.94%); H, 7.30% (7.31%); N, 1.92% (2.36%).

FIG. 1 is a graph of infrared absorption spectrum (NaCl cast film) of the polymer having a number average molecular weight (Mn) of 6,972 and a weight average molecular weight (Mw) of 16,509 in polystyrene conversion molecular weight measured by gel permeation chromatography.

Example 2

A polymer of Example 2 represented by the chemical structure 7 of the present disclosure is obtained in the same manner as in Example 1 except that the boronic acid ester is exchanged with a boronic acid ester represented by the following chemical structure 8.

Chemical Structure 7

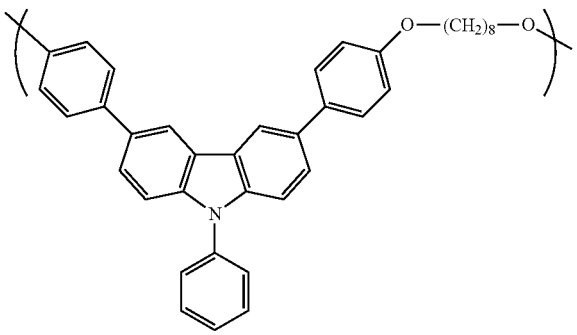

Chemical Structure 8

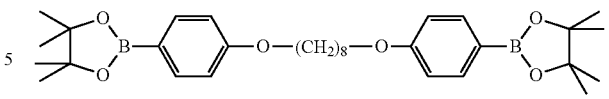

Element Analysis (Calculated Value)

C, 84.79% (84.87%); H, 6.60% (6.57%); N 2.20% (2.61%).

A number average molecular weight (Mn) of 3,130 and a weight average molecular weight (Mw) of 6,697 in polystyrene conversion molecular weight measured by gel permeation chromatography.

Example 3

A polymer of Example 3 represented by the chemical structure 9 of the present disclosure is obtained in the same manner as in Example 1 except that the boronic acid ester is exchanged with a boronic acid ester represented by the following chemical structure 10.

Chemical Structure 9

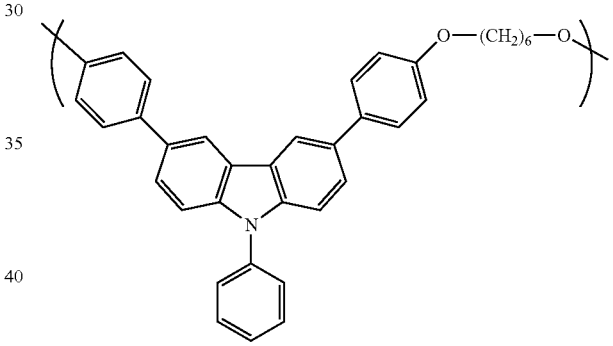

Chemical Structure 10

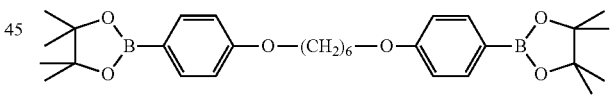

Element Analysis (Calculated Value)

C, 84.60% (84.93%); H, 6.00% (6.14%); N, 2.42% (2.75%)

Polystyrene conversion molecular weight by gel permeation chromatography:—(The polymer is not soluble in tetrahydrofuran and thus the molecular weight thereof is not measured).

Example 4

A polymer of Example 4 represented by the chemical structure 11 shown in Table 2 is obtained in the same manner as in Example 1 except that 3,6-dibromo-N-(p-n-butylphenyl carbazole) is used instead of 3,6-dibromo-N-phenyl carbazole and the boronic acid ester in Table 1 is used instead.

Chemical Structure 11

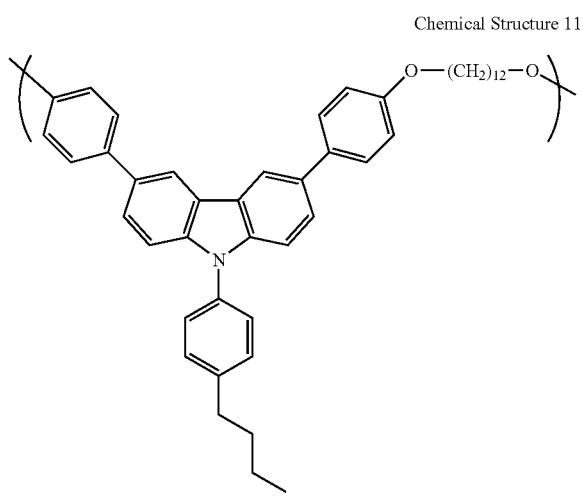

Figure 2:
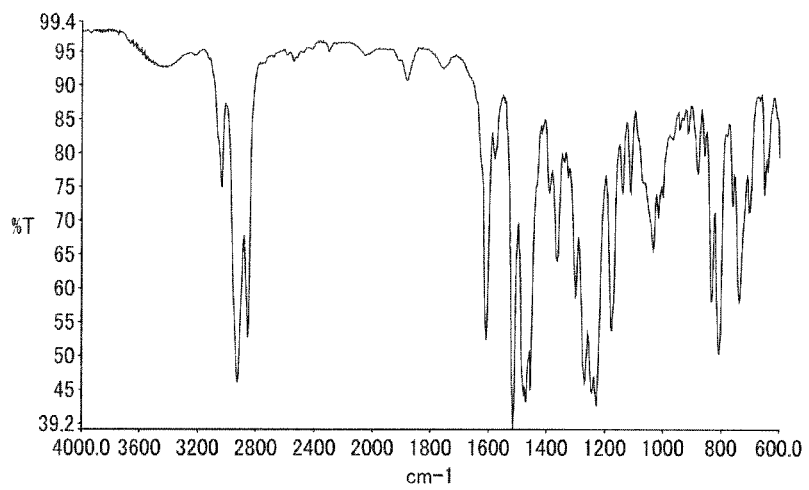
FIG. 2 is a diagram illustrating an infra-red spectrum (NaCl cast film) of a carbazole polymer obtained in Example 4 described later.

FIG. 2 is a diagram illustrating an infra-red spectrum (NaCl cast film) of the polymer obtained in Example 4.

Example 5

A polymer of Example 5 shown in Table 2 is obtained in the same manner as in Example 1 except that 3,6-dibromo-N-(p-n-butylphenyl carbazole) is used instead of 3,6-dibromo-N-phenyl carbazole and the boronic acid ester in Table 1 is used instead.

Example 6

A polymer of Example 6 shown in Table 2 is obtained in the same manner as in Example 1 except that 3,6-dibromo-N-(p-n-butylphenyl carbazole) is used instead of 3,6-dibromo-N-phenyl carbazole and the boronic acid ester in Table 1 is used instead.

Example 7

A polymer of Example 7 shown in Table 2 is obtained in the same manner as in Example 1 except that 3,6-dibromo-N-(p-n-butylphenyl carbazole) is used instead of 3,6-dibromo-N-phenyl carbazole and the boronic acid ester in Table 1 is used instead.

TABLE 1

| Example | Dihalogen compound | Boronic acid ester derivative |
|---|---|---|
| 4 | 3,6-dibromo-N-(p-n-butylphenyl)carbazole | pinacol ester of 4,4'-(dodecane-1,12-diylbis(oxy))bis(phenylboronic acid), $(CH_2)_{12}$ |
| 5 | Same as Example 4 | pinacol ester with $(CH_2)_8$ linker |
| 6 | Same as Example 4 | pinacol ester with $(CH_2)_6$ linker |
| 7 | Same as Example 4 | pinacol ester with $(CH_2)_2$ linker |

TABLE 2

| Example | Mn | Mw | Element Analysis (%) Actual (Calculated) | | |
|---|---|---|---|---|---|
| | | | C | H | N |
| 4 | 7001 | 16501 | 84.65 (85.00) | 7.93 (7.92) | 1.65 (2.16) |
| 5 | 3349 | 6818 | 84.62 (84.94) | 7.30 (7.31) | 1.94 (2.36) |
| 6 | 3875 | 8182 | 84.73 (84.91) | 6.94 (6.96) | 2.08 (2.48) |
| 7 | 2232 | 4066 | 83.38 (84.83) | 5.93 (6.14) | 2.20 (2.75) |

Measuring of Carrier Mobility

10% by weight of toluene solution of the polymer prepared in Example 4 of the present disclosure is applied by blade to an aluminum substrate followed by drying at 120° C. for 30 minutes to form an organic semiconductor film having a thickness of about 7 μm. Thereafter, gold electrodes are deposited on the semiconductor film to form a material for evaluation.

Carrier mobility is obtained by Time of Flight (TOF) method. In the carrier mobility measuring by TOF method, the crossing time of the carrier of the organic semiconductor material through the film is measured. That is, optical carriers are generated by irradiating one side of the material with pulse light by a nitrogen laser beam and the displacement current obtained when an electric field is provided between the two gold electrodes is converted into a voltage by a resistance, which is recorded by an oscilloscope. The time (Tr) of the carrier travelling the distance (L) between the electrodes is obtained by the waveform of the photocurrent. Thereafter, the speed of the carrier is represented by the relationship: V (applied voltage)=L/Tr. When the applied voltage V is uniform between the electrodes, the carrier mobility is calculated by the following relationship using the electric field E (=V/L): $\mu$ (cm/Vs)=$L^2$/(V×Tr) ($\mu$ represents TOF carrier mobility).

Figure 3:
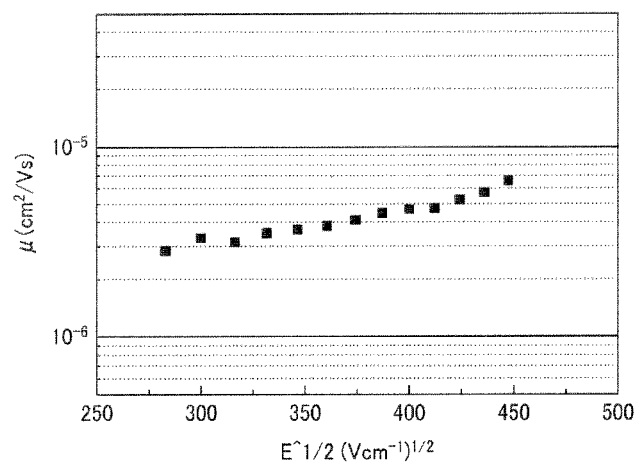
FIG. 3 is a diagram illustrating the hole mobility of the polymer of the present disclosure obtained in Example 4 described later.

FIG. 3 is a diagram illustrating the hole mobility of the polymer of the present disclosure of Example 4.

This document claims priority and contains subject matter related to Japanese Patent Application no. 2010-201624, filed on Sep. 9, 2010, the entire contents of which are hereby incorporated herein by reference.

Having now fully described the invention, it will be apparent to one of ordinary skill in the art that many changes and modifications can be made thereto without departing from the spirit and scope of the invention as set forth therein.

What is claimed as new and desired to be secured by Letters Patent of the United States is:

1. A carbazole polymer comprising:
a repeating unit represented by a chemical structure 1:

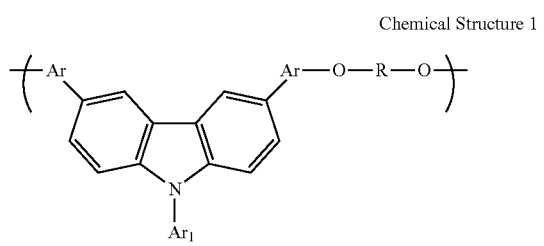

Chemical Structure 1 where R represents an aliphatic or alicyclic bifunctional group, Ar represents an aromatic hydrocarbon or heterocyclic ring bifunctional group, and $Ar_1$ represents an aromatic hydrocarbon or heterocyclic ring monofunctional group.

2. The carbazole polymer according to claim 1, manufactured by reaction between a dihalogen compound represented by a chemical structure 2 and a boronic acid derivative represented by a chemical structure 3:

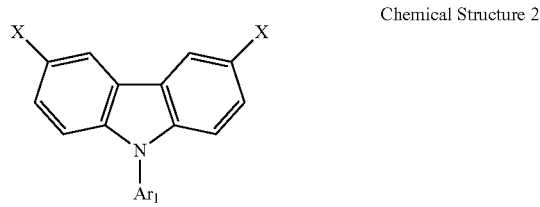

Chemical Structure 2 where X represents a halogen atom; and

Y—Ar—O—R—O—Ar—Y     Chemical Structure 3 where Y represents a boronic acid or an ester thereof.

3. The carbazole polymer according to claim 1, wherein the repeating unit is represented by a chemical structure 4:

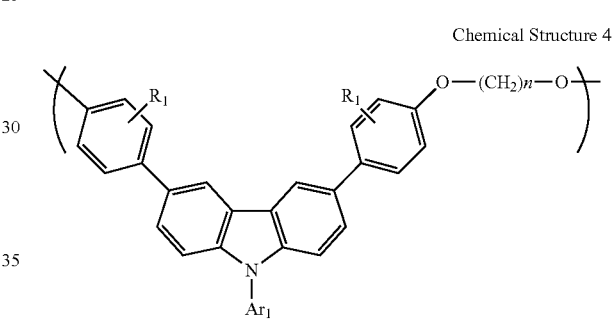

Chemical Structure 4 where $R_1$ represents a hydrogen atom, a substituted or non-substituted alkyl group, a substituted or non-substituted alkoxy group, a halogen atom, a cyano group, a nitro group, or an aromatic hydrocarbon group and n represents an integer of 1 or higher.

4. A method of manufacturing the carbazole polymer according to claim 1, comprising reacting a dihalogen compound represented by a chemical structure 2 with a boronic acid derivative represented by a chemical structure 3:

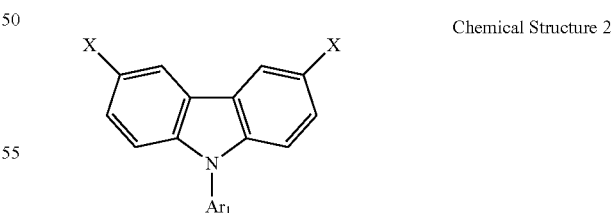

Chemical Structure 2 where X represents a halogen atom; and

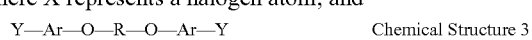

Y—Ar—O—R—O—Ar—Y     Chemical Structure 3 where Y represents a boronic acid or an ester thereof.

\* \* \* \* \*